US012724040B2

(12) United States Patent
Huang et al.

(10) Patent No.: US 12,724,040 B2
(45) Date of Patent: Sep. 1, 2026

(54) HIGH-FREQUENCY CONNECTOR

(71) Applicant: F TIME TECHNOLOGY INDUSTRIAL CO., LTD., New Taipei City (TW)

(72) Inventors: Chien-Chang Huang, New Taipei City (TW); Chang-Lin Peng, New Taipei City (TW)

(73) Assignee: F TIME TECHNOLOGY INDUSTRIAL CO., LTD., New Taipei City (TW)

( * ) Notice: Subject to any disclaimer, the term of this patent is extended or adjusted under 35 U.S.C. 154(b) by 232 days.

(21) Appl. No.: 18/760,185

(22) Filed: Jul. 1, 2024

(65) Prior Publication Data

US 2026/0002962 A1 Jan. 1, 2026

(51) Int. Cl.
*G01R 1/067* (2006.01)

(52) U.S. Cl.
CPC ................................ *G01R 1/06772* (2013.01)

(58) Field of Classification Search
CPC ...................................................... G01R 1/067
See application file for complete search history.

(56) References Cited

U.S. PATENT DOCUMENTS 7,025,599 B1 * 4/2006 Wang ..................... H01R 24/50 439/63
7,416,416 B1 * 8/2008 Hsu ....................... H01R 24/44 439/63
7,794,277 B1 * 9/2010 Peng .................. H01R 13/6582 439/607.01
2017/0123002 A1 * 5/2017 Yeh ...................... G01R 1/0735
2021/0102992 A1 * 4/2021 Cheng ................ G01R 1/07307

FOREIGN PATENT DOCUMENTS

| | | | |
|---|---|---|---|
| CN | 116742411 | A | 9/2023 |
| CN | 220382429 | U | 1/2024 |
| JP | 2007-121247 | A | 5/2007 |
| JP | 2010-177003 | A | 8/2010 |

* cited by examiner

*Primary Examiner* — Dominic E Hawkins

(74) *Attorney, Agent, or Firm* — Birch, Stewart, Kolasch & Birch, LLP

(57) ABSTRACT

A high-frequency connector has a main body, a clamp module, a central probe module, a central elastic unit, a front unit, and a front probe module. The clamp module and the front unit are mounted on the main body. The central probe module is movably mounted in a main channel of the main body and protrudes from a mounting surface of the main body. The front probe module is mounted in a front channel of the front unit and movably connected to the central probe module. The central elastic unit is mounted in the main channel and abuts the central probe module and the front probe module. When a printed circuit board is connected to the high-frequency connector, the central elastic unit keeps pressing the central probe module to prevent formation of a gap between the printed circuit board and the central probe module, reducing the parasitic capacitance.

16 Claims, 17 Drawing Sheets

P
11A
17A
65A
13A
10A
20
30
50
40

HIGH-FREQUENCY CONNECTOR

BACKGROUND

1. Field of the Invention

The present invention relates to a high-frequency connector, especially to a high-frequency connector that is applied to a high-frequency circuit test machine to connect with a printed circuit board.

2. Description of the Prior Arts

A circuit test machine is a device which connects and tests a circuit board, especially a printed circuit board (PCB), and the circuit test machine is configured to test a signal of the printed circuit board to check whether the printed circuit board works normally. Connectors of the circuit test machine to connect the printed circuit board are end-launch type connectors. Each one of the end-launch type connectors has a main body and a central probe module, the main body clamps and fixes the printed circuit board, and the central probe module contacts a microstrip of the printed circuit board to input signals to the printed circuit board.

The end-launch type connector has several advantages. For example, since the connector fixes the printed circuit board by clamping, the connector is capable of connecting printed circuit boards in different thicknesses. In addition, it is easy for a user to connect the printed circuit board to the connector without welding, and thus the connector is reusable. Moreover, the end-launch type connector is narrow in shape, and thus an area on the printed circuit board to be connected to the connector may be reduced. Therefore, the end-launch type connector is suitable for testing and developing high speed digital circuits and millimeter wave circuits which require precise assembling in products.

However, the conventional end-launch type connector needs several components cooperating to clamp and fix the printed circuit board, and a gap may be formed between an edge of the printed circuit board and the central probe module, or formed between the edge of the printed circuit board and the main body of the connector due to a cumulative tolerance among the components or a tolerance in fixation. The gap would lead to accumulation of electric charge and results in parasitic capacitance, such that the frequency and the bandwidth of the signal of the circuit tested are affected. The parasitic capacitance would extremely affect test results of the signals particularly in the high-frequency printed circuit board tests.

To overcome the shortcomings, the present invention provides a high-frequency connector to mitigate or obviate the aforementioned problems.

SUMMARY

The main objective of the present invention is to provide a high-frequency connector that is capable of connecting with a printed circuit board without forming a gap between the printed circuit board and the central probe module.

The high-frequency connector has a main body, a clamp module, a central probe module, a central elastic unit, a front unit, and a front probe module. The main body includes a mounting surface, a first connecting surface, and a main channel. The mounting surface and the first connecting surface are respectively located at two opposite ends of the main body. The main channel is formed through the main body, and the main channel spatially communicates with the mounting surface and the first connecting surface. The clamp module is mounted on the mounting surface of the main body. The central probe module is movably mounted in the main channel, and the central probe module includes a main section and a test end portion. The main section is capable of protruding from the mounting surface, and the testing probe end is connected to an end of the main section, and said end of the main section is oriented toward the mounting surface and protrudes from the mounting surface. The central elastic unit is mounted in the main channel, and an end of the central elastic unit abuts the main section. The front unit is connected to the first connecting surface of the main body. The front unit includes a front channel formed through the front unit. The front channel spatially communicates with two opposite ends of the front unit, and the front channel and the main channel spatially communicate with each other. The front probe module is mounted in the front channel. The central probe module is connected to the front probe module and the central probe module is movable with respect to the front probe module, and another end of the central elastic unit abuts the front probe module.

Due to the central probe module movably mounted in the main channel and the central elastic unit pressing the central probe module, the central probe module is pressed toward the printed circuit board. Therefore, when the printed circuit board is mounted on the high-frequency connector, the central elastic unit presses the central probe module to contact the printed circuit board, and thereby prevents forming a gap, which may generate parasitic capacitance, between the central probe module and the printed circuit board. Hence, the high-frequency connector in this disclosure is suitable for the high-frequency circuit test machine.

Other objectives, advantages and novel features of the invention will become more apparent from the following detailed description when taken in conjunction with the accompanying drawings.

DETAILED DESCRIPTION

Figure 1:
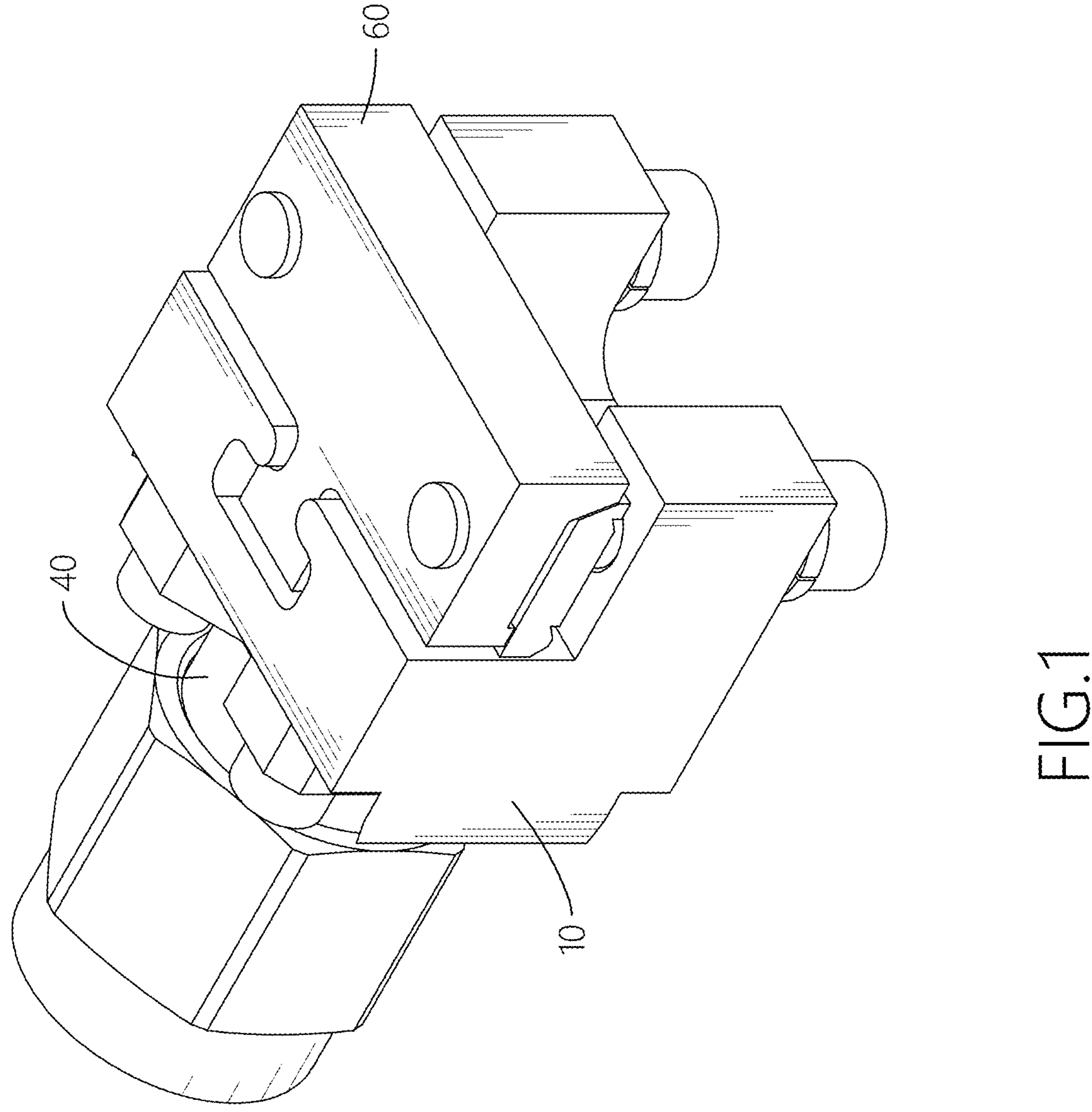
FIG. 1 is a perspective view of a first embodiment of a high-frequency connector in accordance with the present invention.
Figure 2:
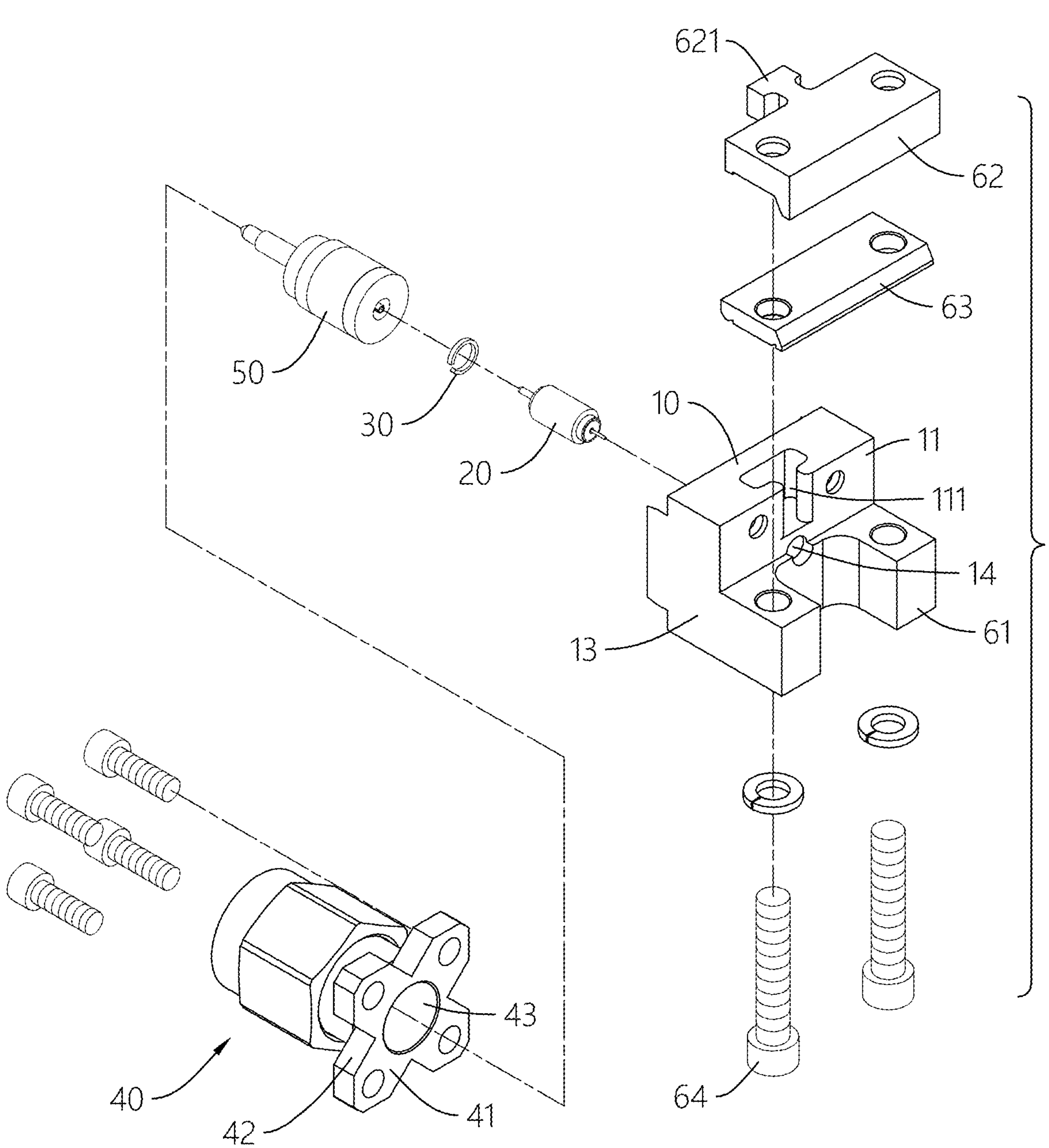
FIG. 2 is an exploded view of the high-frequency connector in FIG. 1.
Figure 3:
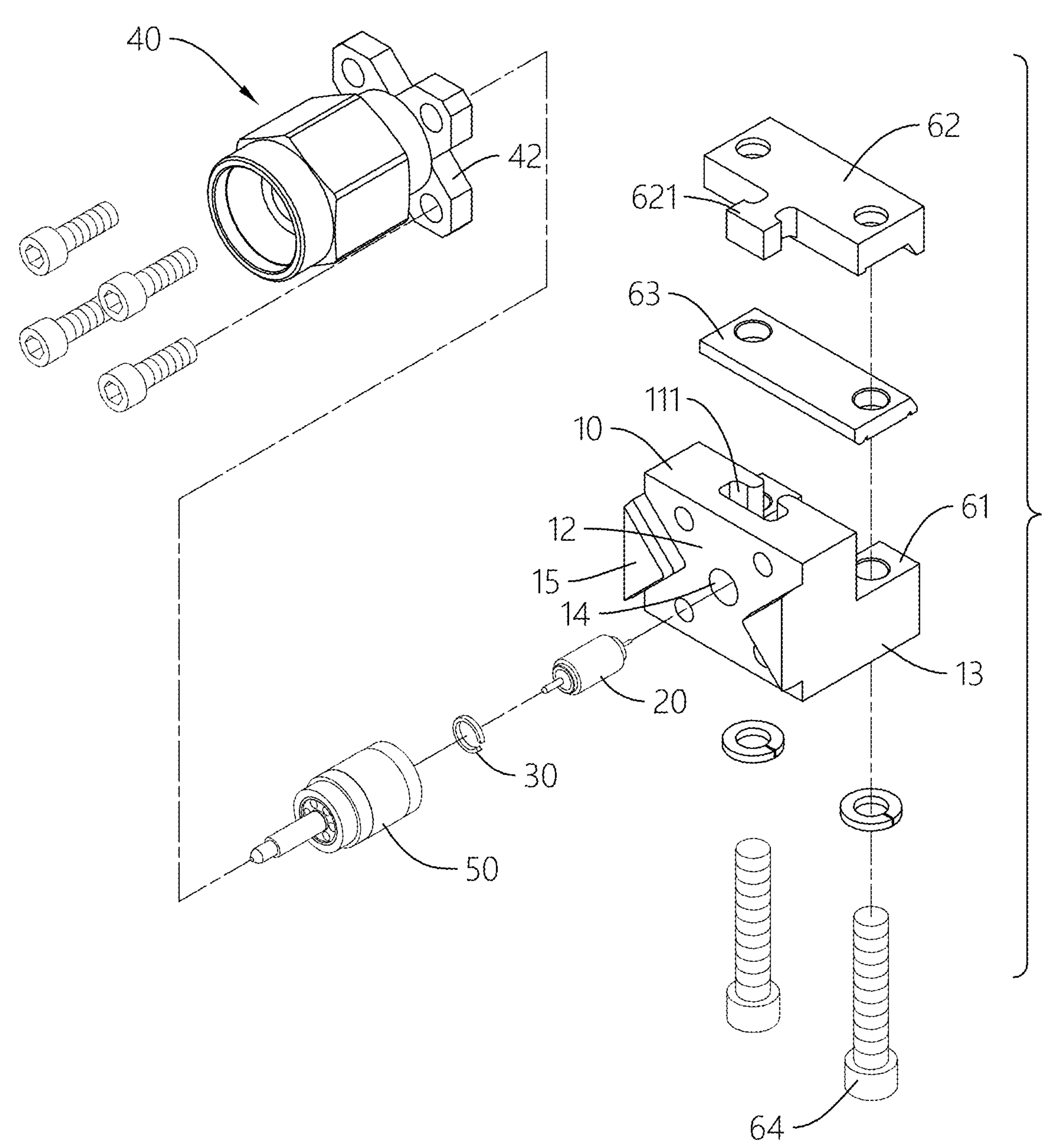
FIG. 3 is another exploded view of the high-frequency connector in FIG. 1, shown in another view angle from FIG. 2.
Figure 4:
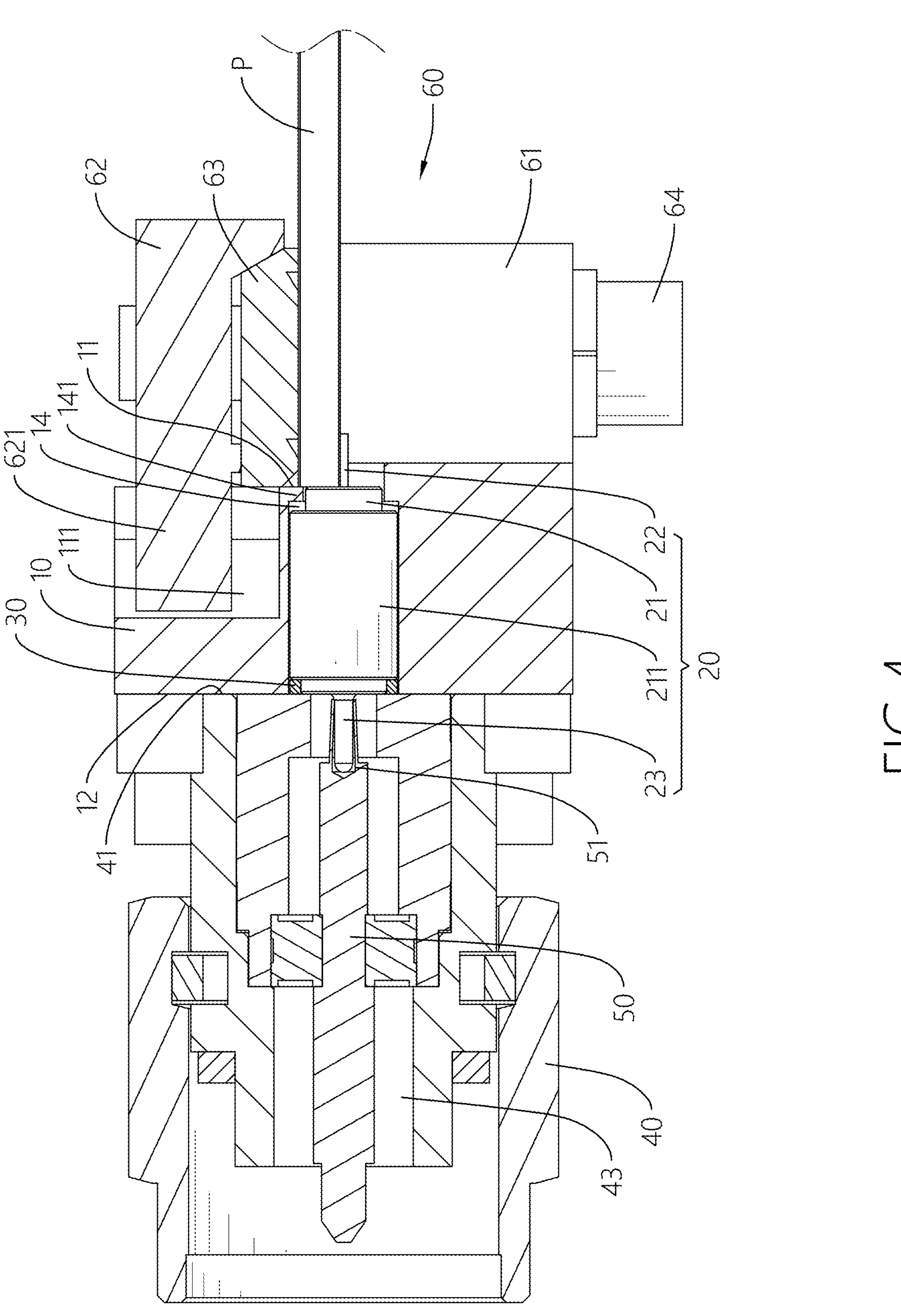
FIG. 4 is a cross-sectional side view of the high-frequency connector in FIG. 1, shown with a printed circuit board connected.
Figure 5:
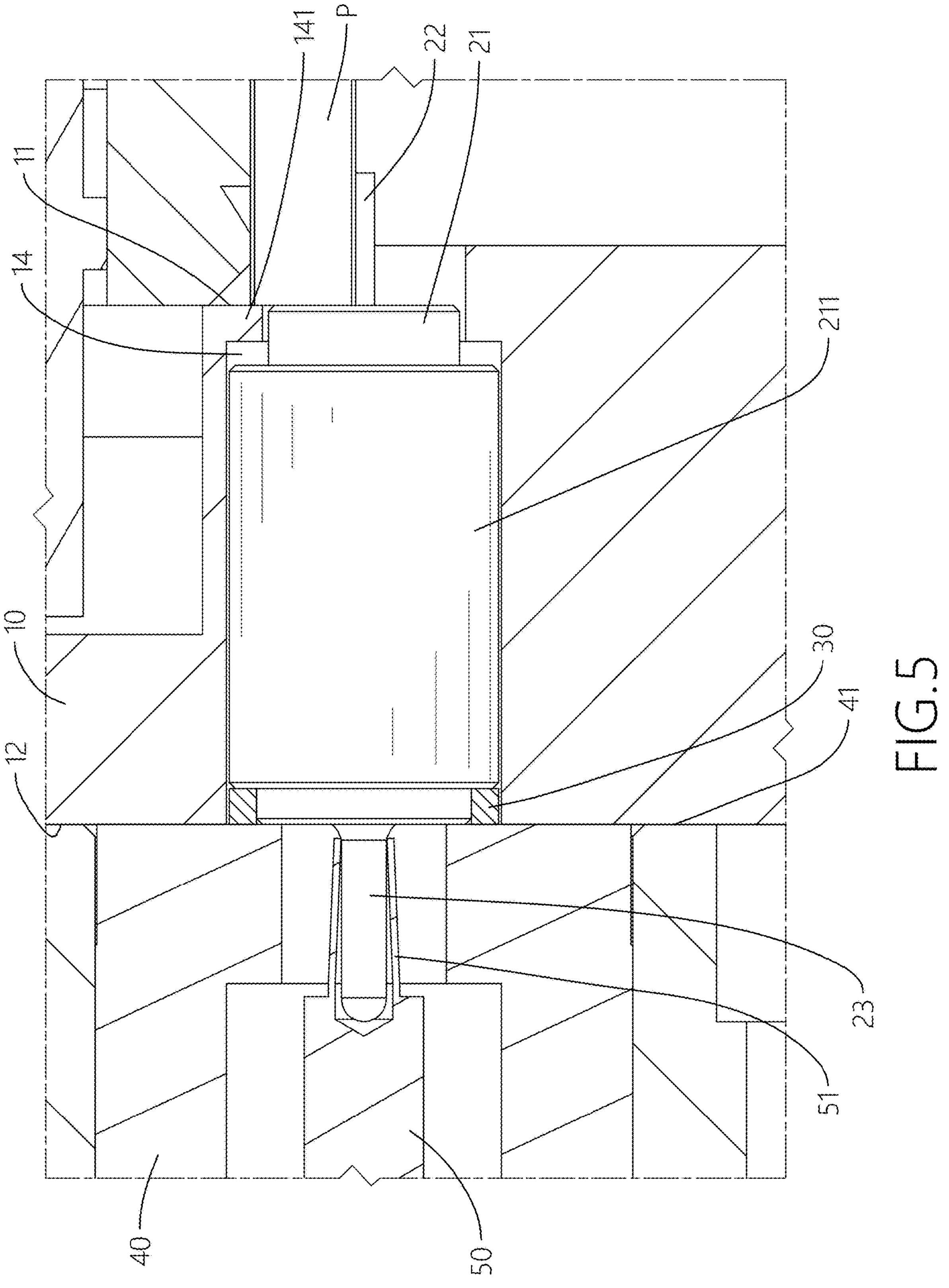
FIG. 5 is a partially enlarged view of FIG. 4.
Figure 6:
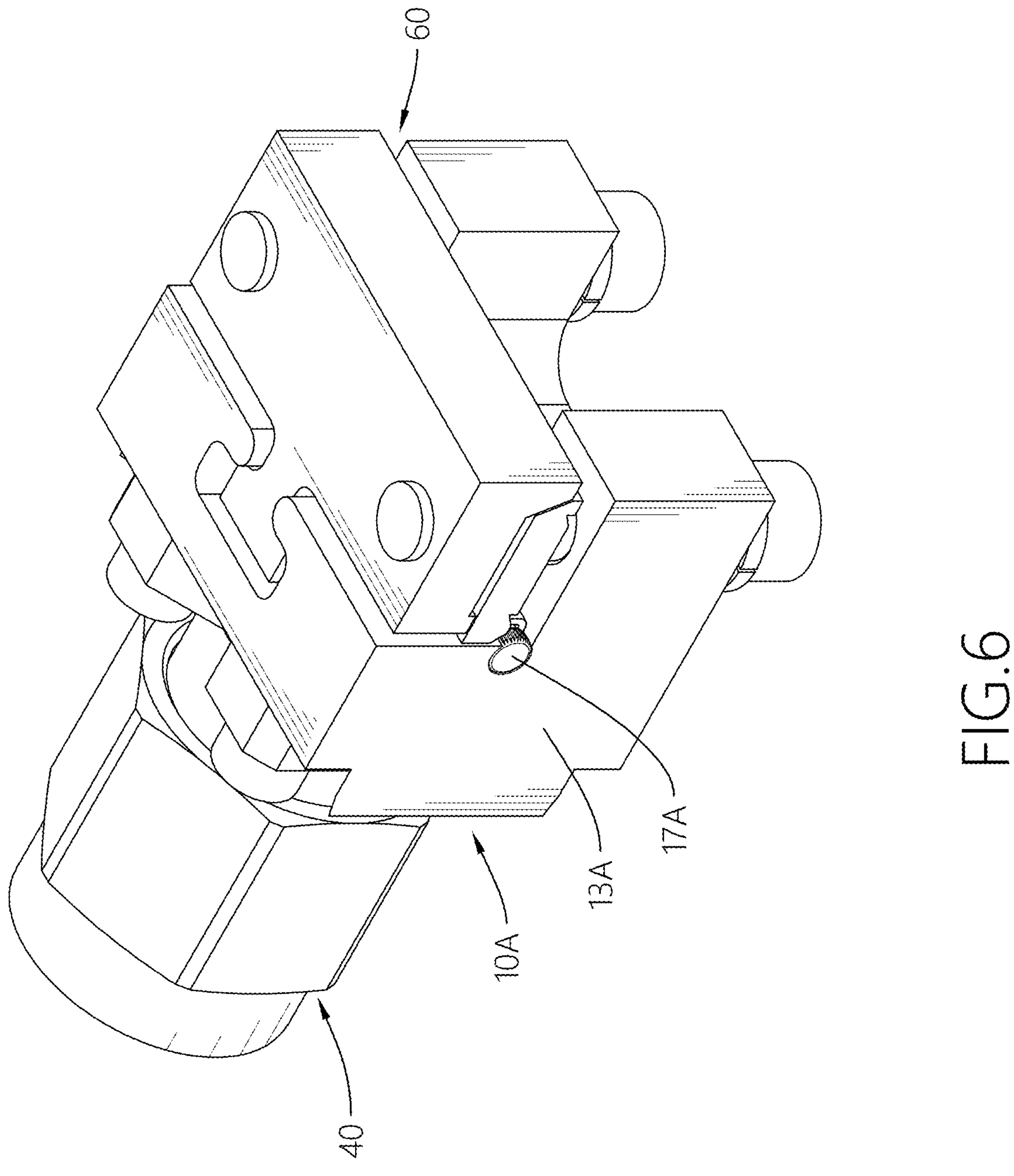
FIG. 6 is a perspective view of a second embodiment of the high-frequency connector in accordance with the present invention.
Figure 7:
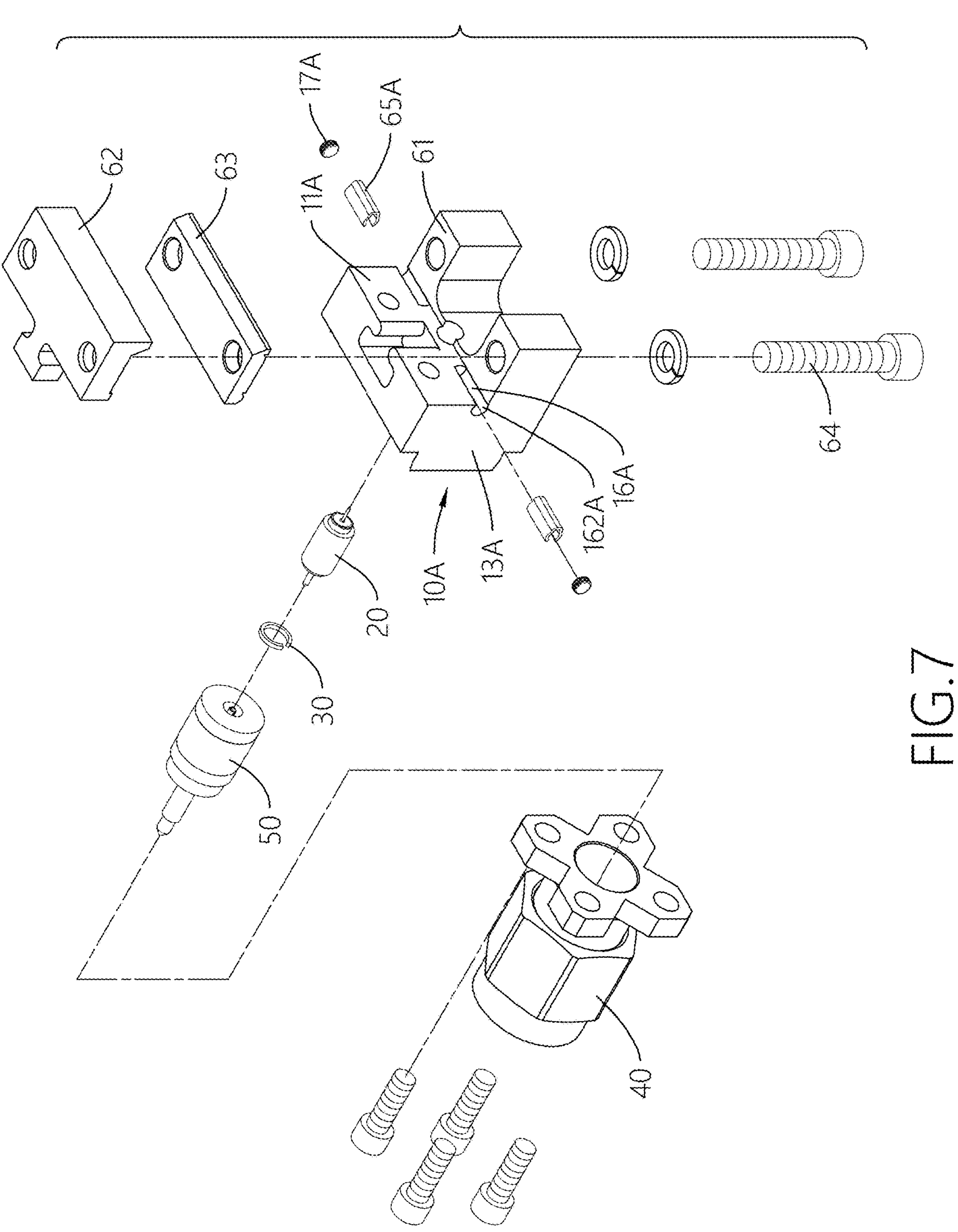
FIG. 7 is an exploded view of the high-frequency connector in FIG. 6.
Figure 8:
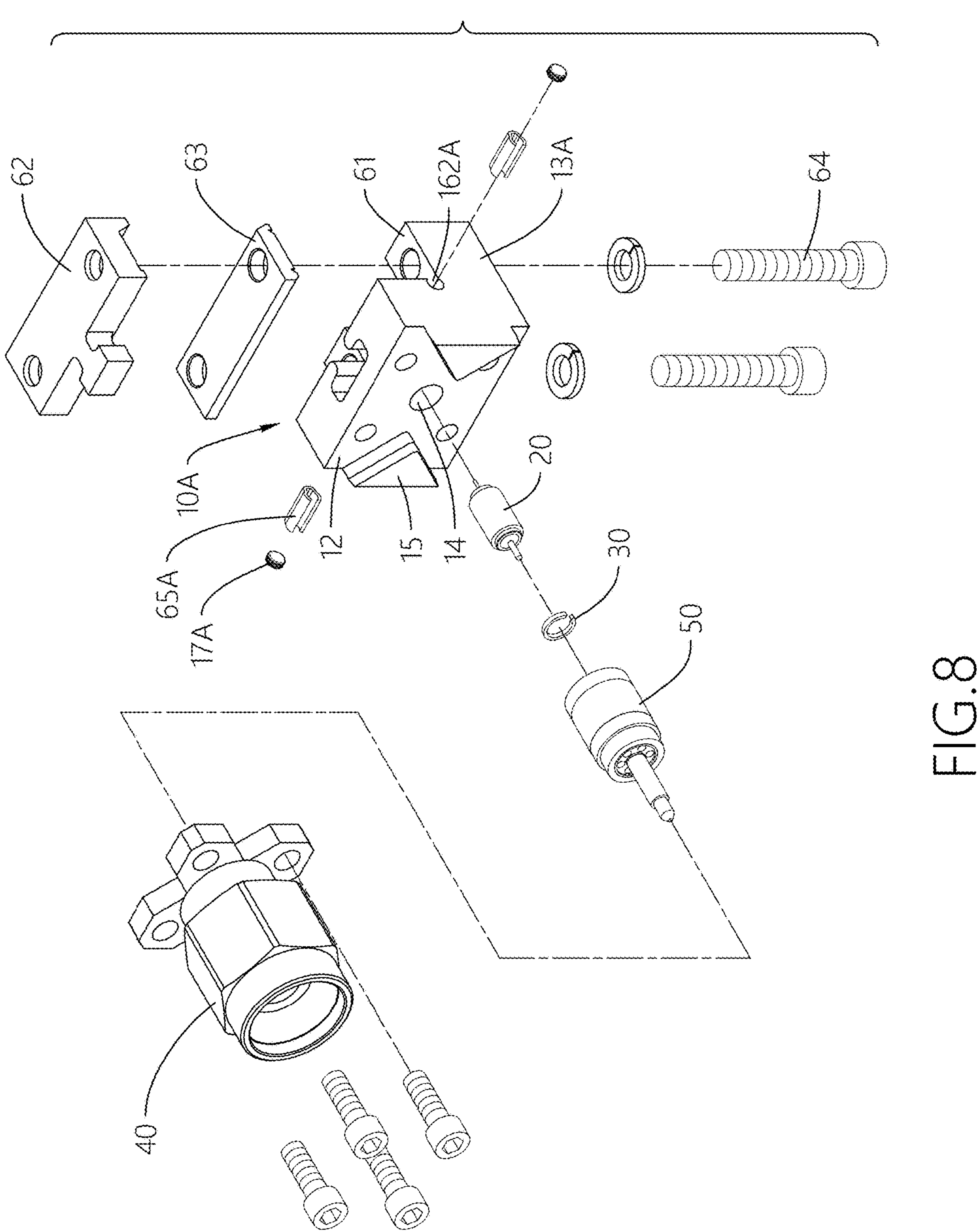
FIG. 8 is another exploded view of the high-frequency connector in FIG. 6, shown in another view angle from FIG. 7.
Figure 9:
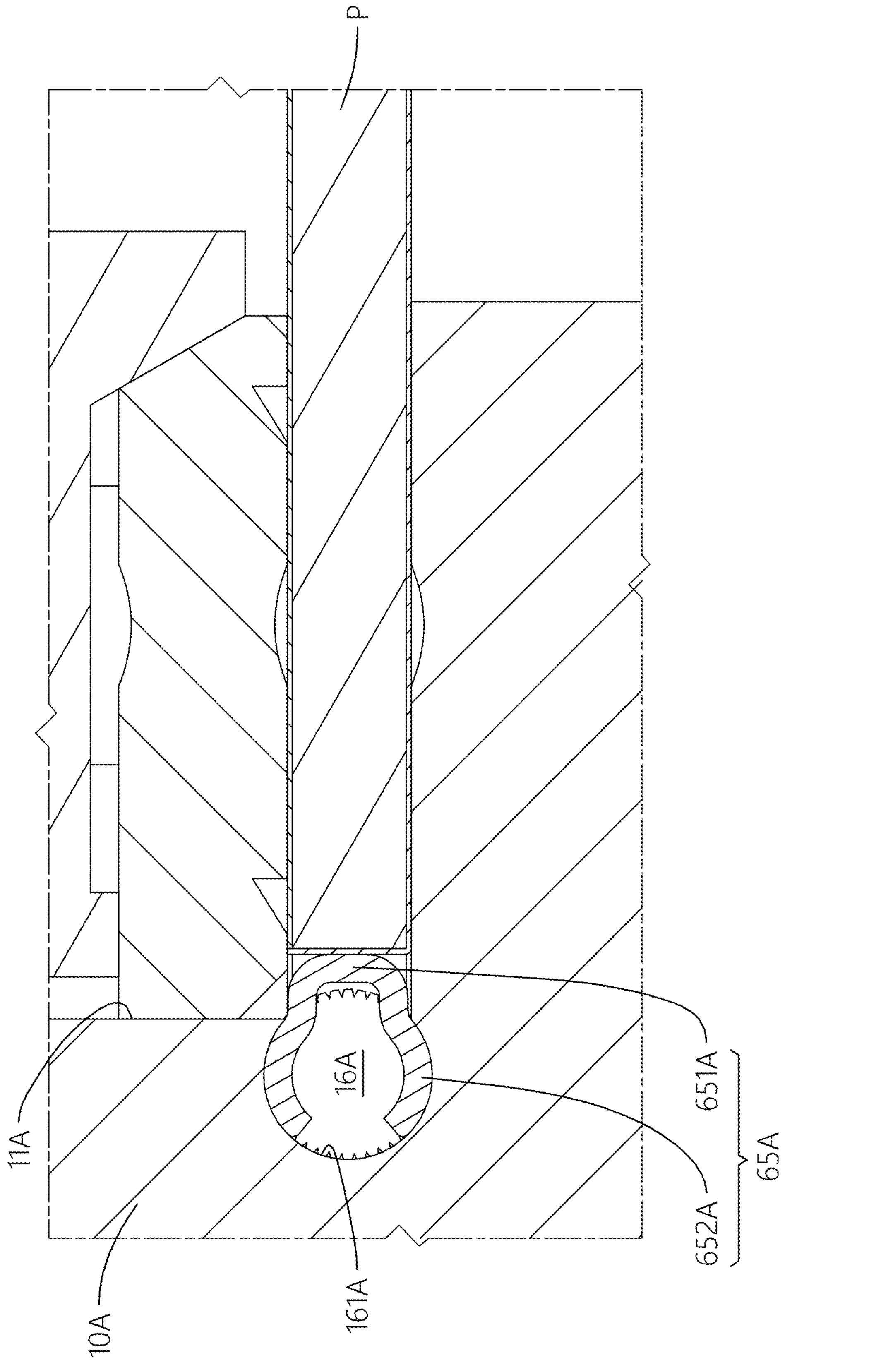
FIG. 9 is a partially enlarged cross-sectional side view of the high-frequency connector in FIG. 6, shown with a printed circuit board connected.
Figure 10:
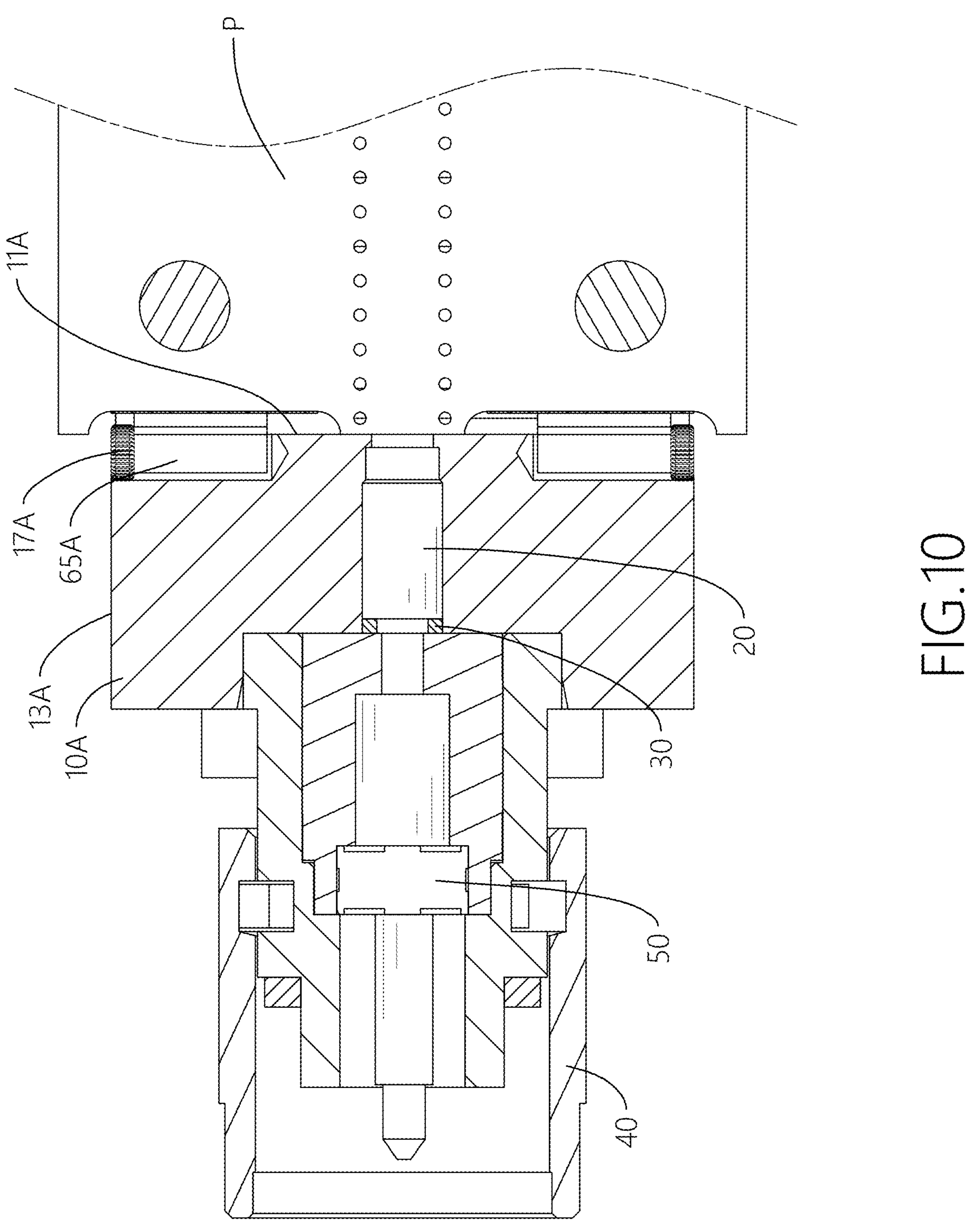
FIG. 10 is a cross-sectional top view of the high-frequency connector in FIG. 6, shown with a printed circuit board connected.

With reference to FIGS. 1 to 5, a first embodiment of a high-frequency connector in accordance with the present invention includes a main body 10, a central probe module 20, a central elastic unit 30, a front unit 40, a front probe module 50, and a clamp module 60.

The main body 10 has a mounting surface 11, a first connecting surface 12, two lateral surfaces 13, a main channel 14, and a first engaging portion 15. The mounting surface 11 and the first connecting surface 12 are respectively located at two opposite ends of the main body 10. The two lateral surfaces 13 are located at two opposite sides of the main body 10, and each one of the lateral surfaces 13 connects with the mounting surface 11 and the first connecting surface 12.

The main channel 14 is formed through the main body 10, and the main channel 14 spatially communicates with the mounting surface 11 and the first connecting surface 12. In this embodiment, the main channel 14 has an annular protrusion 141 which protrudes from an inner wall surface of the main channel 14. The annular protrusion 141 is located at an end of the main channel 14 adjacent to the mounting surface 11, but it is not limited thereto.

The first engaging portion 15 is formed on the first connecting surface 12; in this embodiment, the first engaging portion 15 includes two engaging protrusions, the two engaging protrusions protrude from the first connecting surface 12, and the two engaging protrusions are respectively located at two opposite edges of the first connecting surface 12, but it is not limited thereto, as a configuration and location of the first engaging portion 15 may be altered according to need.

The central probe module 20 is movably mounted in the main channel 14, and the central probe module 20 has a main section 21, a testing probe end 22, and a connecting probe end 23. In this embodiment, the main section 21 is cylindrical in shape and has two opposite end surfaces, one of the two opposite end surfaces faces toward the mounting surface 11, and another one of the two opposite end surfaces faces toward the first connecting surface 12. The main section 21 is capable of protruding from the mounting surface 11.

The testing probe end 22 is connected to the end surface of the main section 21, and said end surface of the main section 21 faces toward the mounting surface 11. The testing probe end 22 protrudes from the mounting surface 11. The connecting probe end 23 is connected to another one of the end surfaces of the main section 21, and said another one of the end surfaces of the main section faces toward the first connecting surface 12. Besides, the main section 21 may further have a limiting portion 211 which protrudes from an outer annular surface of the main section 21. The limiting portion 211 detachably abuts the annular protrusion 141 of the main channel 14 to prevent the central probe module 20 departing from the main channel 14, but it is not limited thereto, as a shape of the central probe module 20 may be altered according to need.

The central elastic unit 30 is mounted in the main channel 14, the central elastic unit 30 abuts an end of the main section 21, and said end of the main section 21 is oriented toward the first connecting surface 12. To be more precise, the central elastic unit 30 in this embodiment is a compression spring, an end of the central elastic unit 30 abuts an end of the limiting portion 211 of the central probe module 20, and said end of the limiting portion 211 is oriented toward the first connecting surface 12, thereby the central elastic unit 30 keeping pressing the central probe module 20 toward the mounting surface 11, and thus the main section 21 of the central probe module 20 protrudes from the mounting surface of the main body 10.

The front unit 40 is connected to the main body 10, and thereby the main body 10 is capable of being connected to a circuit test machine (not shown in the figures). In this embodiment, the front unit 40 is detachably connected to the main body 10, but it is not limited thereto.

The front unit 40 has a second connecting surface 41, a second engaging portion 42, and a front channel 43. The second connecting surface 41 is located at an end of the front unit 40, and said end of the front unit 40 is oriented toward the main body 10. The second connecting surface 41 and the first connecting surface 12 contact and fit each other. Another end of the central elastic unit 30 abuts the second connecting surface 41. The second engaging portion 42 is formed on the second connecting surface 41, and the second engaging portion and the first engaging portion 15 engage with each other. To be more precise, the second engaging portion 42 has two engaging grooves recessed from the second connecting surface 41, shapes and locations of the two engaging grooves respectively correspond to those of the two engaging protrusions of the first engaging portion 15, and thereby the second engaging portion 42 is capable of engaging with the first engaging portion 15.

The front channel 43 is formed through the two opposite ends of the front unit 40. The front channel 43 and the main channel 14 spatially communicate with each other. To be more precise, the front channel 43 forms an opening on the second connecting surface 41, and the front channel 43 spatially communicates with the main channel 14 via the opening.

The front probe module 50 is mounted in the front channel 43. The central probe module 20 is connected to the front probe module 50, and the central probe module 20 is movable with respect to the front probe module 50. To be more precise, the front probe module 50 has an opening, the opening of the front probe module 50 is oriented toward the main channel 14, and a diameter of the opening of the front probe module 50 is less than a diameter of the main channel 14, and thereby said another end of the central elastic unit 30 abuts around the opening of the front probe module 50. The front probe module 50 further has a sleeving portion 51 located in the opening of the front probe module and oriented toward the main body 10. The sleeving portion 51 is sleeved on the connecting probe end 23 of the central probe module 20.

The clamp module 60 is mounted on the mounting surface 11 of the main body 10, and in this embodiment, the clamp module 60 includes a fixing base 61, a clamping board 62, a pressing board 63, and multiple fixing units 64. The fixing base 61 protrudes from the mounting surface 11 of the main body 10. The clamping board 62 is mounted on the mounting surface 11 of the main body 10, and the clamping board 62 is movable with respect to the fixing base 61. To be more precise, a limiting track 111 is recessed from the mounting surface 11, and the limiting track 111 extends along a direction perpendicular to the fixing base 61; a sliding protrusion 621 being T-shaped protrudes from an edge of the clamping board 62. The sliding protrusion 621 is located in the limiting track 111, and thereby the clamping board 62 is capable of moving along an extending direction of the limiting track 111 with respect to the fixing base 61, but it is not limited thereto.

The pressing board 63 is located between the fixing base 61 and the clamping board 62, and the fixing units 64 are mounted through the fixing base 61, the clamping board 62, and the pressing board 63, and thus a relative distance among the fixing base 61, the clamping board 62, and the pressing board 63 is fixed by the fixing units 64. The fixing units 64 in this embodiment are bolts, but it is not limited thereto.

When a printed circuit board P is connected to the high-frequency connector, an end of the printed circuit board P is clamped by the clamp module 60. To be more precise, the printed circuit board P is placed between the pressing board 63 and the fixing base 61. Next, make sure that the printed circuit board P has contacted with the testing probe end 22 of the central probe module 20, and then slightly push the printed circuit board P toward the mounting surface 11 to ensure that the printed circuit board P contacts the main section 21 of the central probe module 20. Finally, firmly clamp the printed circuit board P between the fixing base 61 and the pressing board 63 via the fixing units 64 and the clamping board 62, and the connection is completed.

Since the central elastic unit 30 in the main channel 14 keeps pressing the central probe module 20 toward the mounting surface 11, an end surface of the main section 21 of the central probe module 20 would contact the printed circuit board P to prevent forming a gap between the central probe module 20 and the printed circuit board P, and said end surface of the main section 21 is oriented toward the mounting surface 11.

With reference to FIGS. 6 to 11, a second embodiment of the high-frequency connector is similar to the first embodiment. A main difference between the second embodiment and the first embodiment is that the main body 10A in this embodiment may further have a mounting groove 16A. The mounting groove 16A is recessed from the mounting surface 11A, and the clamp module further includes an abutting elastic unit 65A.

In this embodiment, the main body 10 has two of the mounting grooves 16A, the two mounting grooves 16A respectively extend toward the two lateral surfaces 13A of the main body 10A, and each one of the mounting grooves 16A forms a lateral opening 162A on a corresponding one of the lateral surfaces 13A. Each one of the mounting grooves 16A is cylindrical in shape and has an inner annular wall surface 161A, but it is not limited thereto, as the shape of the mounting groove 16A may be altered according to need. In addition, the high-frequency connector in this embodiment may further include two covers 17A. The two covers 17A respectively cover the lateral openings 162A which are formed on the two lateral surfaces 13A of the main body 10A by the mounting grooves 16A, but it is not limited thereto.

The abutting elastic unit 65A is mounted on the main body 10A and protrudes from the mounting surface 11A, thereby the abutting elastic unit 65A capable of contacting the printed circuit board P. To be more precise, in this embodiment, the high-frequency connector includes two of the abutting elastic units 65A, and the two abutting elastic units 65A are respectively mounted in the two mounting grooves 16A of the main body 10A.

Each one of the abutting elastic units 65A has a contacting portion 651A and a deforming portion 652A. The contacting portion 651A protrudes from the mounting surface 11A of the main body 10A, and the contacting portion 651A is movable with respect to the mounting surface 11. The contacting portion 651A is configured to contact the printed circuit board P. The deforming portion 652A is connected to the contacting portion 651A, and the deforming portion 652A is mounted in the mounting groove 16A. In this embodiment, the abutting elastic unit 65A may have two of the deforming portions 652A. To be more precise, the contacting portion 651A is a curved board such that the contacting portion 651A has a U-shaped cross-section, and the two deforming portions 652A are respectively connected to two opposite ends of the cross-section of the contacting portion 651A, and the two deforming portions 652A extend along an axial direction of the mounting groove 16A. Therefore, the two deforming portions 652A are spaced apart from each other and fit the inner annular wall surface 161A of the mounting groove 16A, but it is not limited thereto, as a configuration of the abutting elastic unit 65A may be altered according to need.

The abutting elastic unit 65A mounted in the mounting groove 16A is capable of contacting the printed circuit board P, and thus prevents forming a gap between the main body 10A and the printed circuit board P. To be more precise, when the printed circuit board P is pushed toward the mounting surface 11A, the printed circuit board P would press and contact the contacting portion 651A of the abutting elastic unit 65A, and thus the deforming portion 652A would be deformed and store elastic potential. In this embodiment, when the abutting elastic unit 65A is pressed such that the contacting portion 651A moves toward the mounting surface 11A, the two deforming portions 652A would move along the inner annular wall surface 161A of the mounting groove 16A to approach each other, and thus the deforming portions 652A gain the elastic potential, thereby the abutting elastic unit 65A capable of restoring.

When the connection of the printed circuit board P to the high-frequency connector is completed, the elasticity of the abutting elastic unit 65A keeps the contacting portion 651A contacting the printed circuit board P, thereby preventing forming a gap between the abutting elastic unit 65A and the printed circuit board P. Since the abutting elastic unit 65A is connected to the main body 10A, the abutting elastic unit 65A is viewed as extension of the main body 10A, and thus the abutting elastic unit 65A is capable of preventing forming a gap between the main body 10A and the printed circuit board P.

Figure 11:
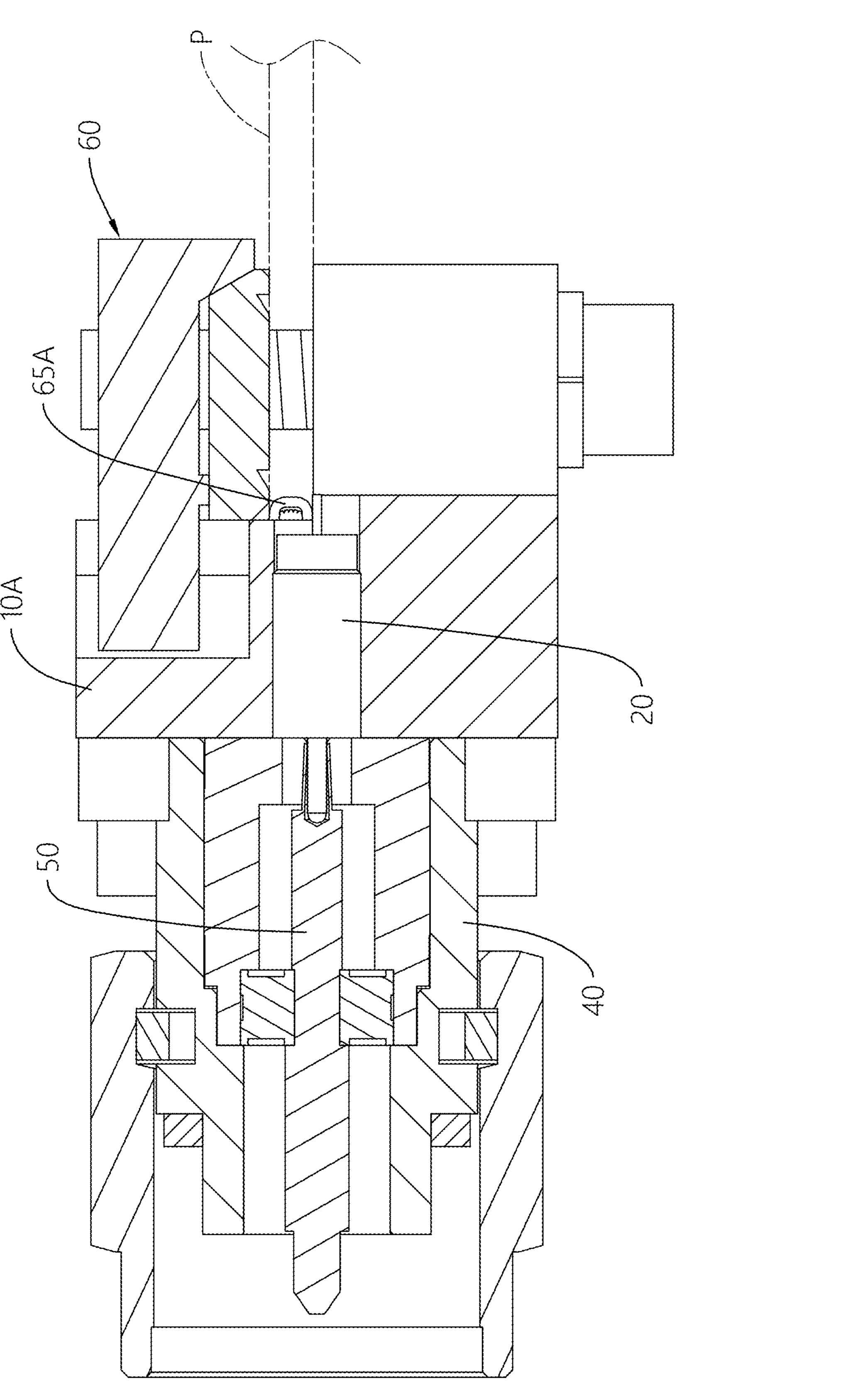
FIG. 11 is a cross-sectional side view of a third embodiment of the high-frequency connector in accordance with the present invention, shown with a printed circuit board connected.

Besides, as shown in FIG. 11, a third embodiment of the high-frequency connector, the abutting elastic unit 65A may be installed in a high-frequency connector without the central elastic unit 30. In other words, the abutting elastic unit 65A does not have to be applied to a high-frequency connector accompanied with the central elastic unit 30.

Figure 12:
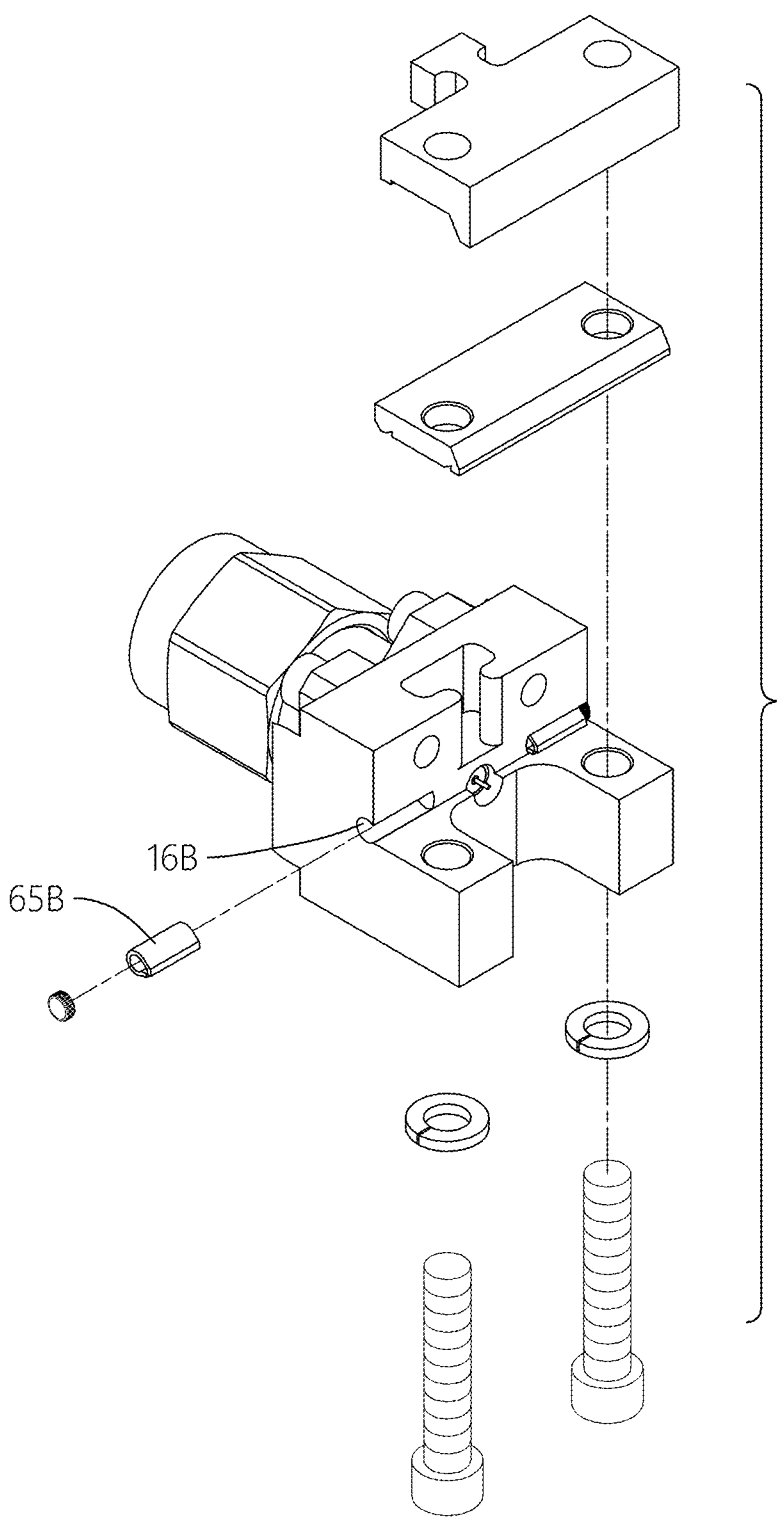
FIG. 12 is a partially exploded perspective view of a fourth embodiment of the high-frequency connector in accordance with the present invention, shown with a clamp module exploded.
Figure 13:
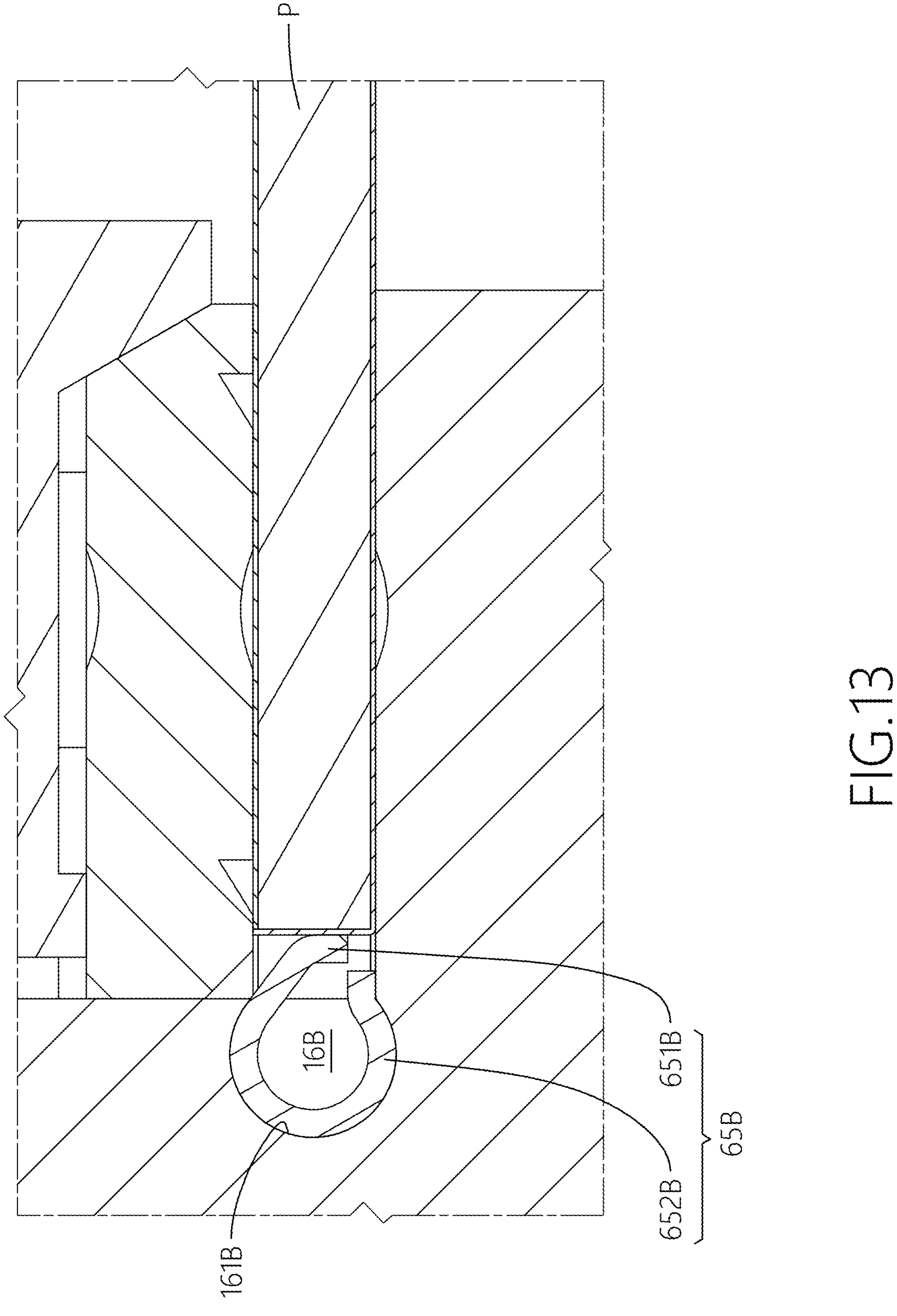
FIG. 13 is a partially enlarged cross-sectional side view of the high-frequency connector in FIG. 12.

With reference to FIGS. 12 and 13, a fourth embodiment of the high-frequency connector is similar to the second embodiment, and a main difference between the fourth embodiment and the second embodiment is the shape of the abutting elastic unit 65B. To be more precise, the contacting portion 651B of the abutting elastic unit 65B in the fourth embodiment has a notch, and the deforming portion 652B completely fits and contacts the inner annular wall surface 161B of the mounting groove 16B. Hence, the abutting elastic unit 65B in the fourth embodiment may be tougher than the abutting elastic unit 65A in the second embodiment.

Figure 14:
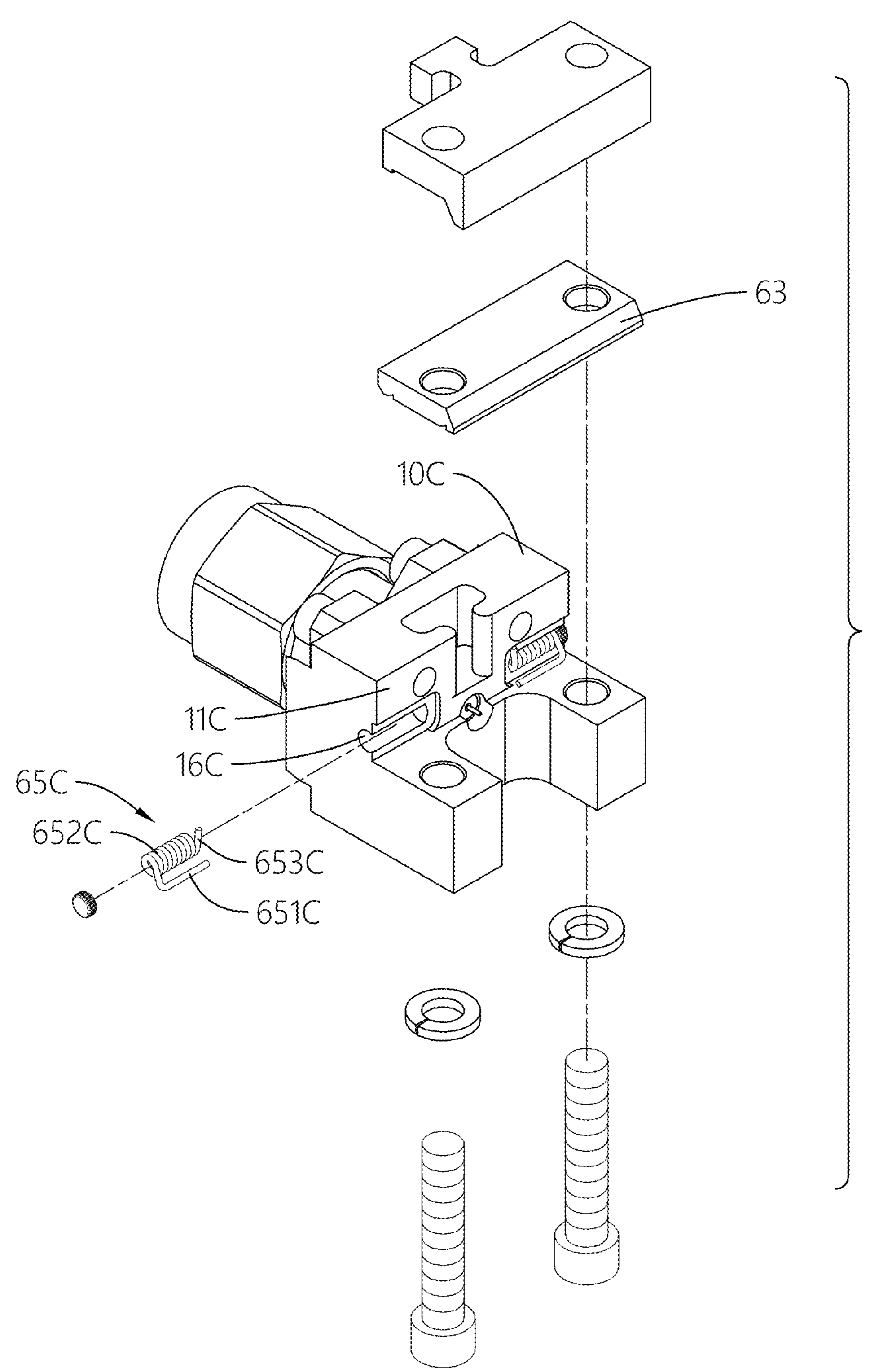
FIG. 14 is a partially exploded perspective view of a fifth embodiment of the high-frequency connector in accordance with the present invention, shown with a clamp module exploded.
Figure 15:
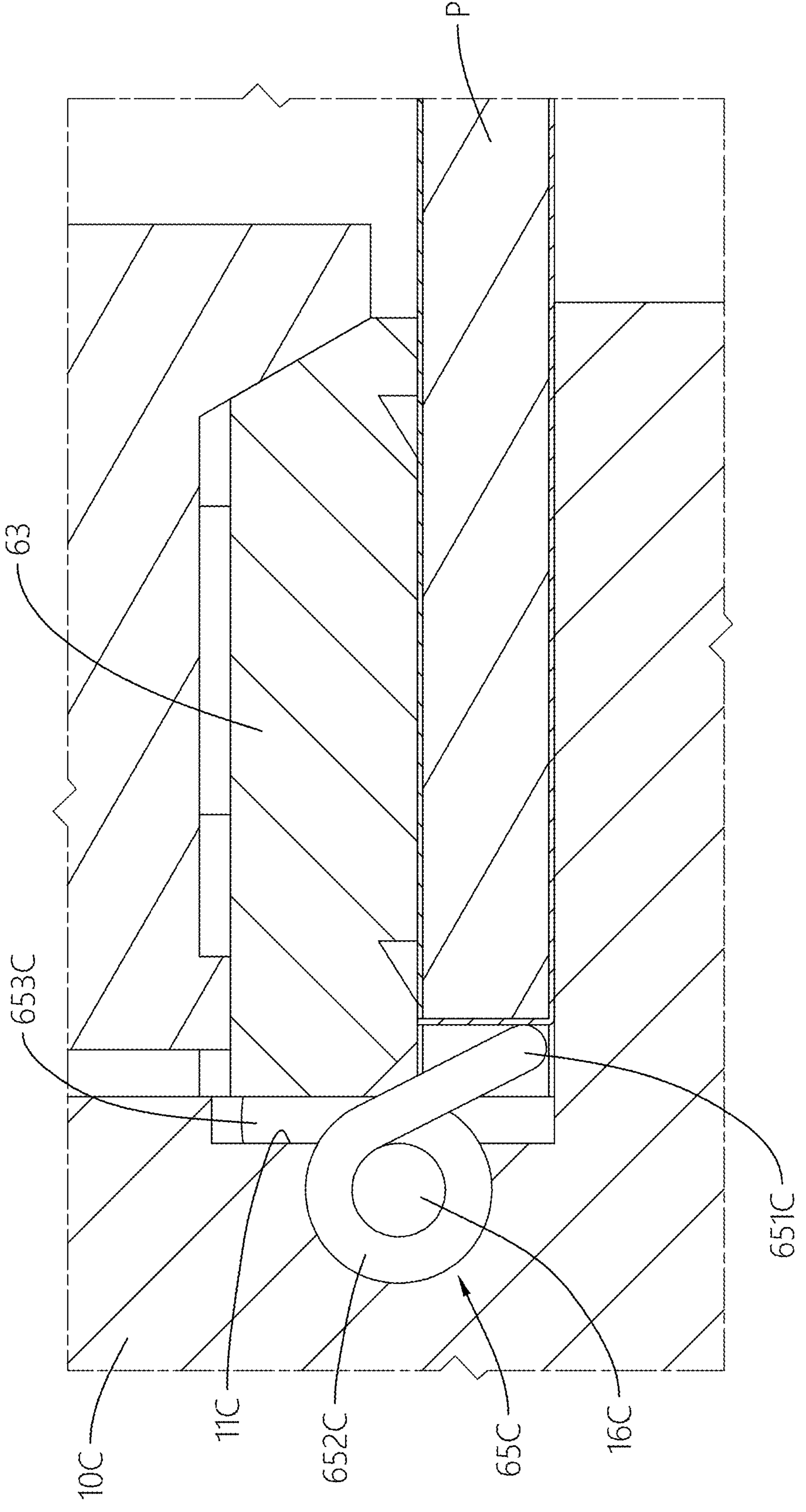
FIG. 15 is a partially enlarged cross-sectional side view of the high-frequency connector in FIG. 14.

With reference to FIGS. 14 and 15, a fifth embodiment of the high-frequency connector is similar to the second embodiment, and the main difference between the fifth embodiment and the second embodiment is the abutting elastic unit 65C. The abutting elastic unit 65C in the fifth embodiment has a fixed portion 653C. The fixed portion 653C is connected to the deforming portion 652C and protrudes from the mounting surface 11C of the main body 10C, and the fixed portion 653C is clamped between the pressing board 63 and the mounting surface 11C.

To be more precise, in this embodiment, the abutting elastic unit 65C is a torsion spring, the spiral part of the torsion spring is the deforming portion 652C, and the contacting portion 651C and the fixed portion 653C are respectively connected to two opposite ends of the deforming portion 652C. The contacting portion 651C is rod-shaped and extends along an axial direction of the deforming portion 652C. The fixed portion 653C is rod-shaped and extends into a space between the pressing board 63 and the mounting surface 11C, thereby preventing the abutting elastic unit 65C from shifting or even getting out of the mounting groove 16C when the contacting portion 651C is being pressed by the printed circuit board P, but it is not limited thereto, as configurations of the contacting portion 651C and the fixed portion 653C may be altered according to need.

Figure 16:
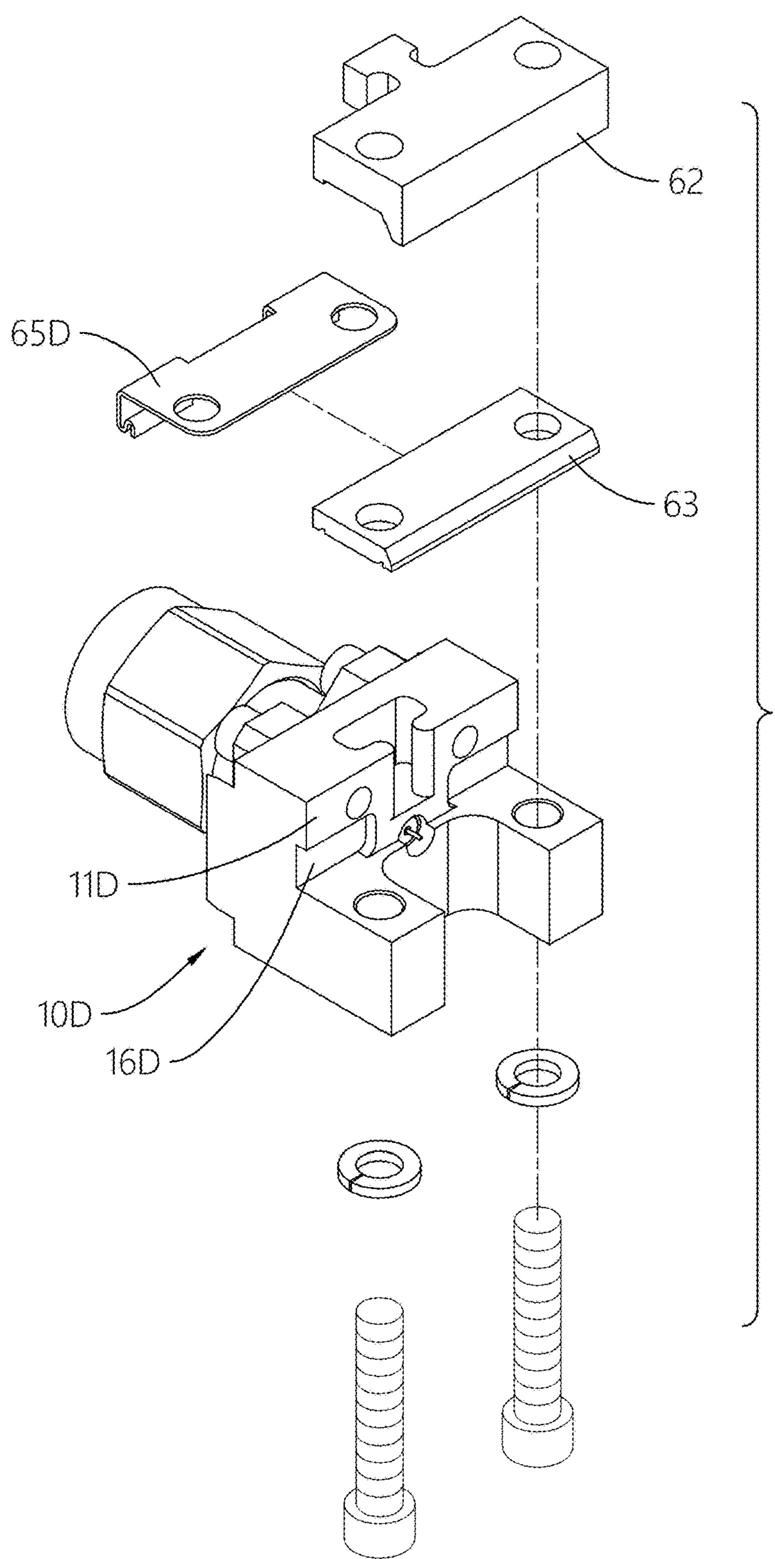
FIG. 16 is a partially exploded perspective view of a sixth embodiment of the high-frequency connector in accordance with the present invention, shown with a clamp module exploded.
Figure 17:
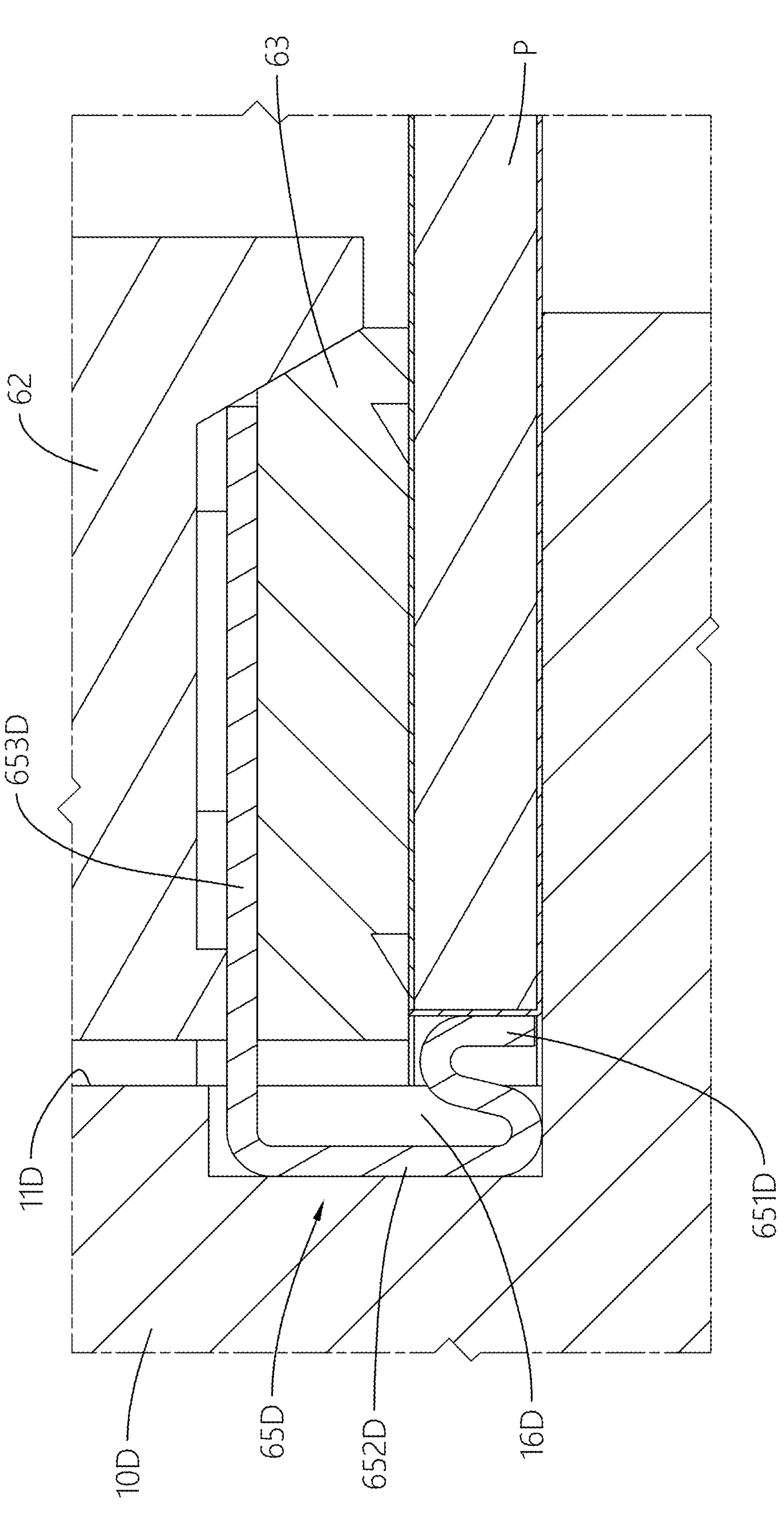
FIG. 17 is a partially enlarged cross-sectional side view of the high-frequency connector in FIG. 16.

With reference to FIGS. 16 and 17, a sixth embodiment of the high-frequency connector is similar to the fifth embodiment. The main difference between the sixth embodiment and the fifth embodiment is the shape of the abutting elastic unit 65D. The abutting elastic unit 65D in the sixth embodiment has a contacting portion 651D, a deforming portion 652D, and a fixed portion 653D. The fixed portion 653D is connected to the deforming portion 652D and protrudes from the mounting surface 11D of the main body 10D, but the shape of the abutting elastic unit 65D in the sixth embodiment is different from the fifth embodiment. In the sixth embodiment, the fixed portion 653D of the abutting elastic unit 65D is clamped between the clamping board 62 and the pressing board 63. Likely, the fixed portion 653D is capable of helping prevent the abutting elastic unit 65D from shifting or even getting out of the mounting groove 16D when the contacting portion 651D is being pressed.

In summary, the central probe module 20 of the high-frequency connector in this disclosure is movably mounted in the main channel 14 of the main body 10, and the central elastic unit 30 is also mounted in the main channel 14. When the printed circuit board P is connected to the high-frequency connector, the central elastic unit 30 is capable of keeping pressing the central probe module 20 toward the printed circuit board P, thereby preventing forming a gap between the printed circuit board P and the central probe module 20, and thus reduces the parasitic capacitance. Furthermore, the high-frequency connector may have the abutting elastic unit 65A mounted in the mounting groove 16A of the main body 10. The abutting elastic unit 65A is extension of the main body 10A, and the abutting elastic unit 65A is capable of continuously abutting the printed circuit board P via the elastic potential stored when pressed by the printed circuit board P. Therefore, the abutting elastic unit 65A is capable of preventing forming a gap between the main body 10 and the printed circuit board P, and thus reduces the parasitic capacitance as well. As a result, the high-frequency connector in this disclosure is suitable for testing the printed circuit board P which has high-frequency circuits, and the user can obtain accurate outcome without interference of the parasitic capacitance.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A high-frequency connector comprising:

a main body including:

a mounting surface and a first connecting surface respectively located at two opposite ends of the main body; and a main channel formed through the main body, the main channel spatially communicating with the mounting surface and the first connecting surface;

a clamp module mounted on the mounting surface of the main body;

a central probe module movably mounted in the main channel, and the central probe module including:

a main section capable of protruding from the mounting surface; and a testing probe end connected to an end of the main section, said end of the main section oriented toward the mounting surface and protruding from the mounting surface;

a central elastic unit mounted in the main channel, and an end of the central elastic unit abutting the main section;

a front unit connected to the first connecting surface of the main body; the front unit including:

a front channel formed through the front unit, the front channel spatially communicating with two opposite ends of the front unit, and the front channel and the main channel spatially communicating with each other; and a front probe module mounted in the front channel, the central probe module connected to the front probe module and the central probe module being movable with respect to the front probe module; another end of the central elastic unit abutting the front probe module.

2. The high-frequency connector as claimed in claim 1, wherein:

the main body further includes:

a first engaging portion formed on the first connecting surface; and the front unit further includes:

a second connecting surface located on one of the opposite two ends of the front unit, and said end of the front unit oriented toward the main body; the second connecting surface and the first connecting surface contacting and fitting with each other; and a second engaging portion formed on the second connecting surface, and the second engaging portion and the first engaging portion engaging with each other.

3. The high-frequency connector as claimed in claim 2, wherein:

the central probe module further includes:

a connecting probe end located on another end of the main section, said another end of the main section oriented toward the first connecting surface; and the front probe module further includes:

a sleeving portion located on an end of the front probe module, said end of the front probe module oriented toward the main body, and the sleeving portion sleeved on the connecting probe end.

4. The high-frequency connector as claimed in claim 3, wherein:

the clamp module includes:

a fixing base protruding from the mounting surface of the main body;

a clamping board mounted on the mounting surface of the main 2 body, and the clamping board capable of moving with respect to the fixing base; and a pressing board located between the fixing base and the clamping board; and the high-frequency connector further includes:

an abutting elastic unit mounted on the main body and protruding from the mounting surface.

5. The high-frequency connector as claimed in claim 4, wherein, the main body further includes:

a mounting groove recessed from the mounting surface, and the abutting elastic unit mounted in the mounting groove.

6. The high-frequency connector as claimed in claim 5, wherein, the abutting elastic unit includes:

a contacting portion protruding from the mounting surface of the main body, and being movable with respect to the mounting surface; the contacting portion configured to contact a printed circuit board; and a deforming portion connected to the contacting portion, and the deforming portion located in the mounting groove.

7. The high-frequency connector as claimed in claim 6, wherein:

the mounting groove is cylindrical in shape and has an inner annular wall surface, and the deforming portion fits the inner annular wall surface of the mounting groove.

8. The high-frequency connector as claimed in claim 7, wherein, the abutting elastic unit further includes:

a fixed portion connected to the deforming portion, and the fixed portion protruding from the mounting surface of the main body; the fixed portion clamped between the clamping board and the pressing board.

9. The high-frequency connector as claimed in claim 7, wherein, the abutting elastic unit further includes:

a fixed portion connected to the deforming portion, and the fixed portion protruding from the mounting surface of the main body; the fixed portion clamped between the pressing board and the mounting surface.

10. The high-frequency connector as claimed in claim 1, wherein:

the central probe module further includes:

a connecting probe end located on another end of the main section, said another end of the main section oriented toward the first connecting surface; and the front probe module further includes:

a sleeving portion located on an end of the front probe module, said end of the front probe module oriented toward the main body, and the sleeving portion sleeved on the connecting probe end.

11. The high-frequency connector as claimed in claim 1, wherein:

the clamp module includes:

a fixing base protruding from the mounting surface of the main body;

a clamping board mounted on the mounting surface of the main body, and the clamping board capable of moving with respect to the fixing base; and a pressing board located between the fixing base and the clamping board; and the high-frequency connector further includes:

an abutting elastic unit mounted on the main body and protruding from the mounting surface.

12. The high-frequency connector as claimed in claim 11, wherein, the main body further includes:

a mounting groove recessed from the mounting surface, and the abutting elastic unit mounted in the mounting groove.

13. The high-frequency connector as claimed in claim 12, wherein, the abutting elastic unit includes:

a contacting portion protruding from the mounting surface of the main body, and being movable with respect to the mounting surface; the contacting portion configured to contact a printed circuit board; and a deforming portion connected to the contacting portion, and the deforming portion located in the mounting groove.

14. The high-frequency connector as claimed in claim 13, wherein:

the mounting groove is cylindrical in shape and has an inner annular wall surface, and the deforming portion fits the inner annular wall surface of the mounting groove.

15. The high-frequency connector as claimed in claim 13, wherein, the abutting elastic unit further includes:

a fixed portion connected to the deforming portion, and the fixed portion protruding from the mounting surface of the main body; the fixed portion clamped between the clamping board and the pressing board.

16. The high-frequency connector as claimed in claim 13, wherein, the abutting elastic unit further includes:

a fixed portion connected to the deforming portion, and the fixed portion protruding from the mounting surface of the main body; the fixed portion clamped between the pressing board and the mounting surface.

* * * * *